United States Patent [19]

Lampert

[11]  4,064,660

[45]  Dec. 27, 1977

[54] PROCESS FOR PREPARING HAZE FREE SEMICONDUCTOR SURFACES AND SURFACES SO MADE

[75] Inventor: Ingolf Lampert, Burghausen, Germany

[73] Assignee: Wacker-Chemitronic Gesellschaft fur Elektronik-Grundstoffe mbH, Burghausen, Germany

[21] Appl. No.: 715,031

[22] Filed: Aug. 17, 1976

[30] Foreign Application Priority Data

Sept. 1, 1975 Germany .............................. 2538855

[51] Int. Cl.$^2$ .............................................. B24B 1/00
[52] U.S. Cl. .............................. 51/283 R; 51/281 SF; 51/317; 51/308
[58] Field of Search .................... 51/281 SF, 283, 307, 51/308, 317

[56] References Cited

U.S. PATENT DOCUMENTS

| | | | |
|---|---|---|---|
| 2,997,827 | 8/1961 | Giffen | 51/283 X |
| 3,429,080 | 2/1969 | Lachapelle | 51/317 X |
| 3,877,183 | 4/1975 | Deckert | 51/283 |

OTHER PUBLICATIONS

V. L. Rideout, "Polishing Technique For GaAs", I.B.M. Technical Disclosure Bulletin, vol. 15, No. 3, Aug. 1972.

*Primary Examiner*—Gary L. Smith
*Attorney, Agent, or Firm*—Allison C. Collard

[57] ABSTRACT

Process for producing haze free semiconductor surfaces, especially surfaces of (111)-oriented gallium arsenide, by polishing, which comprises subjecting the surfaces to the polishing action of a mixture of (a) an aqueous suspension containing one or several polishing agents selected from quartz, silica, a silicate and a fluosilicate, and having a pH within the range of from 6 to 8 and, (b) an aqueous solution of hydrogen peroxide having a pH likewise ranging from 6 to 8, the latter being present in an amount of 2 to 15% by weight of $H_2O_2$. The invention also relates to the haze free semiconductor surfaces so made.

7 Claims, No Drawings

PROCESS FOR PREPARING HAZE FREE SEMICONDUCTOR SURFACES AND SURFACES SO MADE

The present invention relates to an improved process for producing haze-free semiconductor surfaces by polishing, and surfaces so made.

In order to be suitable for use in the manufacture of semiconductor components, the surfaces of semiconductor bodies have to meet extremely high requirements, especially in the case of epitaxial growth of monocrystalline layers. Previous mechanical working of the semiconductor, for example, results in disturbances of the crystal structure at the semiconductor surface. Such disturbances may be scratches, resulting from, for example, saw-cutting of the semiconductor, or they may be a result of the lapping process. Such disturbances all result in a lowering of the yield of electronic components. This is especially the case when (111)-oriented gallium arsenide is treated which presents particular difficulties to polishing.

In order to render the surfaces smooth, they may be polished with a polishing agent containing one or more of the following: quartz, a silica, silicate and a fluosilicate. The polishing agent may also contain an alkali, for chemical polishing.

While conventionally polished, or etched, surfaces may appear fault-free when examined under a microscope, they do not stand up to a test procedure which has become accepted in the electronics industry for testing semiconductor surfaces for smoothness: the surfaces are viewed, in a darkened room, under a sharply focused intense light beam. Any disturbances of the crystal surface, and also any dirt particles or residues from previous washing processes, cause scattering of the light beam. Such disturbances can be detected more easily in this manner than by examination under a microscope.

When surfaces that have been polished in the manner described above are examined by this test procedure, it is found that any disturbances in the surface have been eliminated but that the surface is still slightly rough. This microroughness, which is of the order of the wavelength of light, cannot be detected by the naked eye, or even under a microscope with a high degree of magnification, but it causes slight scattering of the focused light beam, which shows up as a milky-grey surface at the point of incidence of the beam. This phenomenon is known as "haze".

A process to produce substantially haze-free semiconductor surfaces has been described in which the semiconductor surface is first polished by means of a conventional polishing agent of the type described above and then polished by means of a second polishing agent containing, in addition to the components mentioned above, a monohydric alcohol having 3, 4 or 5 carbon atoms and a small amount of a polyvinyl alcohol. Although the described process has the advantage of producing substantially haze-free semiconductor surfaces, it has the disadvantage that the high vapor pressure of some of the alcohols used can be extremely unpleasant for the personnel operating the polishing machines. Moreover, although the process is particularly suitable for polishing silicon surfaces, it is not so suitable for polishing the surfaces of (111)-orientated gallium arsenide crystals: the surfaces of such crystals are particularly difficult to polish because many polishing agents preferentially abrade the crystal surface in a particular direction.

A process for polishing gallium arsenide discs is described in German Auslegeschrift No. 1,546,063, which uses a solution of bromine in methanol as the polishing agent. However, a combination of bromine with an organic solvent involves the danger of vigorous reactions. Moreover, in polishing (111)-orientated gallium arsenide discs, it is necessary to use a very dilute solution of bromine with the result that very long polishing times are required.

The use of hydrogen peroxide with an adjusted pH as a polishing agent for gallium arsenide discs is described in German Offenlegungsschrift No. 2,220,963. Again, however, the polishing rate is very low and the results obtained are generally unsatisfactory.

Gallium arsenide discs may also be polished with an aqueous solution of an alkali metal hypochlorite and an alkali metal carbonate, as described in German Offenlegungsschrift No. 2,249,142. The results obtained do not satisfy present-day requirements, especially in the case of (111) orientated gallium arsenide discs. In that process, free chlorine, which is corrosive, is liberated during polishing.

It is the object of the present invention to provide a process for producing haze free semiconductor surfaces by polishing, which avoids the shortcomings of the known art.

It is a further object of the invention to provide a process for polishing semiconductor surfaces, especially (111)-oriented gallium arsenide discs having haze free surfaces, in a single operation.

Other objects and advantages of the invention will become apparent from the following detailed description.

According to the invention, the above ends are obtained by a process which comprises polishing the surface by means of a polishing agent containing a mixture of (a) an aqueous suspension of a compound selected from a member of the group consisting of quartz, silica, silicate, and/or a fluosilicate, and having a pH within the range of from 6 to 8 and; (b) from 2-15% by weight of an aqueous solution of hydrogen peroxide having a pH within the range of from 6 to 8.

By means of this process, it is possible to polish semiconductor surfaces, especially (111)-orientated gallium arsenide crystals to give a haze free surface and at a higher polishing rate than was hitherto possible.

Known aqueous polishing suspensions may be used in the polishing agents used according to the present invention. They advantageously contain precipitated silicates or fluosilicates, such as described in German Offenlegungsschrift No. 1,752,163. Examples of such silicates are those of the metals of groups IIa, IIb, IIIa and IIIb of the periodic system, and the heavy metal silicates, for example, the silicates of zirconium, iron, lead, nickel, cobalt, also silicates of magnesium, calcium, strontium, barium, zinc, and aluminum. Examples of fluosilicates are those of the metals of groups Ia, Ib, IIa, IIb, IIIa and IIIb of the periodic system, for example, the fluosilicates of sodium, potassium, magnesium, calciumbrium, aluminum, and zinc.

Silica gels and silica sols such as described, for example, in U.S. Pat. No. 3,170,273, and quartz powder, such as described in, for example, German Auslegeschrift No. 1,219,764, may be used as the polishing agent.

The size of the solid particles in the polishing suspension is advantageously within the range of from 5 to 200 μ.

The aqueous suspension of the quartz, silica, silicate or fluosilicate may suitably be prepared by mixing 1 part by weight of the said solid component with from 1 to 10, preferably from 3 to 5, parts by weight of water. The pH of this suspension may then be adjusted to a value within the range of from 6 to 8, preferably from 6.5 to 7.5, with the use of an acid. Suitable acids for this purpose are, for example, phosphoric acid, sulphuric acid, acetic acid, oxalic acid and, especially, hydrochloric acid.

The aqueous hydrogen peroxide solution is suitably one containing from 2 to 15% by weight of hydrogen peroxide. The pH of the solution may be adjusted to a value within the range of from 6 to 8, preferably from 6.5 to 75, by means of an alkali. Suitable alkalies for this purpose are aqueous solutions of sodium hydroxide, potassium hydroxide and ammonia.

The aqueous suspension and the hydrogen peroxide solution may then be thoroughly mixed in order to give a polishing agent used according to the invention. These two components may be mixed in widely varying proportions, but it is preferred to mix them in such proportions that the polishing agent contains from 2 to 15%, especially from 4 to 8%, by weight of hydrogen peroxide. Both components of the polishing agent may be used for at least 24 hours at the given pH range. Advantageously, the two components, namely the aqueous suspension and the hydrogen peroxide solution, are separately conveyed to the polishing machine by means of suitable pumps and are mixed only immediately prior to use, that is immediately prior to flowing out onto the polishing disc: this has the advantage of ensuring a constant composition of the polishing agent throughout the polishing process.

Polishing may be effected using the type of machine conventionally used for polishing semiconductor discs, and also using conventional polishing cloths. The rate of abrasion of the semiconductor disc will, of course, depend on a number of factors including the speed at which the polishing machine is operated, the particular semiconductor material and its crystallographic orientation, any dopants present in the semiconductor, and the polishing cloth used. The rate of abrasion is, however, generally of the order of 25 μ/h, which is relatively high.

Although the present process is particularly suitable for polishing both gallium rich sides and arsenic rich sides of (111)-orientated gallium arsenide crystals, which is generally regarded as difficult, the process is also suitable for polishing gallium arsenide crystals of other orientations and for polishing other semiconductor materials, for example, silicon and germanium, which may or may not contain a dopant.

By means of the present process, scratch free, jet-black and haze free semiconductor surfaces may be obtained, which satisfy the requirements for the manufacture of electronic components. Furthermore, the polishing agent used in the present process does not result in corrosion of the polishing machine as do some polishing agents.

The following example of the process according to the invention is given by way of illustration and not of limitation.

Five liters of waterglass (30% by weight $SiO_2$) and 2.5kg of calcium chloride hexahydrate were suspended in 40 liters of water and adjusted to pH 7 with concentrated hydrochloric acid. Thirty liters of a 30% by weight aqueous hydrogen peroxide solution were then adjusted to pH 7 with an aqueous ammonia solution. Both solutions were conveyed separately to a polishing machine, by means of pumps, and were mixed together only immediately before flowing onto the polishing disc. Various semiconductor discs were polished with this polishing agent using a speed of 90 rpm and a contact pressure of 0.2 kp/cm$^2$.

1. (100)-orientated gallium arsenide discs doped with tellurium were polished. The rate of abrasion was 15 μ/h using a soft polishing cloth and 10 μ/h using a hard polishing cloth.

2. (100)-orientated gallium arsenide discs doped with chromium were polished. The rate of abrasion using a soft cloth was 17 μ/h and using a hard cloth was 10 μ/h.

3. (111)-orientated gallium arsenide discs doped with selenium were polished. The rate of abrasion with a soft polishing cloth was 25 μ/h and with a hard polishing cloth was 20 μ/h.

In general, 80 to 100 μ/h were abraded from the discs. The polished gallium arsenide discs showed surfaces which had been perfectly polished so that they were haze free when examined under a focused beam of light.

What is claimed is:

1. A process for preparing haze free 111-oriented gallium arsenide surfaces by polishing, which comprises subjecting the surfaces to the polishng action of (a) an aqueous suspension containing a polishing agent of the group consisting of quartz, silica, a silicate, a fluosilicate and a mixture thereof, having a pH range from 6–8, in mixture with (b) an aqueous solution of 2–15% by weight of hydrogen peroxide likewise having a pH of 6–8.

2. The process according to claim 1, wherein the pH of the aqueous suspension and the pH of the aqueous solution is within the range of from 6.5 to 7.5.

3. The process according to claim 1, wherein the aqueous solution contains from 4 to 8% by weight of hydrogen peroxide.

4. The process according to claim 1, wherein the aqueous suspension and the aqueous solution are transported to the polishing operation separately and only mixed immediately prior to polishing.

5. The process according to claim 1, wherein the aqueous suspension comprises a silicate selected from the group consisting of the metals zirconium, iron, lead, nickel, cobalt, magnesium, calcium, strontium, barium, zinc and aluminum.

6. The process according to claim 1, wherein the aqueous suspension comprises a fluosilicate selected from the group of metals consisting of sodium, potassium, magnesium, calcium, barium, aluminum and zinc.

7. A gallium arsenide body having a haze free surface that has been polished by a process according to claim 1.

* * * * *